(12) United States Patent
Chuang et al.

(10) Patent No.: US 9,053,990 B2
(45) Date of Patent: Jun. 9, 2015

(54) BUMP INTERCONNECTION TECHNIQUES

(71) Applicant: Taiwan Semiconductor Manufacturing Co., Ltd., Hsin-Chu (TW)

(72) Inventors: Chita Chuang, Kaohsiung (TW); Yao-Chun Chuang, Hsinchu (TW); Yu-Chen Hsu, Hsinchu (TW); Ming Hung Tseng, Toufen Township (TW); Chen-Shien Chen, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/660,441

(22) Filed: Oct. 25, 2012

(65) Prior Publication Data

US 2014/0117532 A1    May 1, 2014

(51) Int. Cl.
*H01L 23/48* (2006.01)
*H01L 23/00* (2006.01)

(52) U.S. Cl.
CPC ............ *H01L 24/13* (2013.01); *H01L 24/81* (2013.01); *H01L 2224/16225* (2013.01); *H01L 2924/13091* (2013.01); *H01L 24/05* (2013.01); *H01L 24/16* (2013.01); *H01L 2224/0401* (2013.01); *H01L 2224/05567* (2013.01); *H01L 2224/05624* (2013.01); *H01L 2224/05647* (2013.01); *H01L 2224/13022* (2013.01); *H01L 2224/13082* (2013.01); *H01L 2224/13111* (2013.01); *H01L 2224/13147* (2013.01); *H01L 2224/16238* (2013.01); *H01L 2224/81024* (2013.01); *H01L 2224/81447* (2013.01); *H01L 2224/81815* (2013.01); *H01L 2224/81911* (2013.01)

(58) Field of Classification Search
CPC ............ H01L 2924/014; H01L 24/13; H01L 2224/16237; H01L 2224/81191; H01L 2225/06513; H01L 2224/73253; H01L 2224/13007; H01L 2224/13022; H01L 23/485; H01L 24/81; H01L 2224/16225; H01L 2924/0002
USPC .......... 257/737, 762, 780, 738, 778; 438/108, 438/614, 612
See application file for complete search history.

(56) References Cited

U.S. PATENT DOCUMENTS

| | | | | |
|---|---|---|---|---|
| 8,486,760 | B2 * | 7/2013 | Chung et al. | 438/108 |
| 8,558,379 | B2 * | 10/2013 | Kwon | 257/737 |
| 8,592,995 | B2 * | 11/2013 | Lin et al. | 257/778 |
| 2003/0019568 | A1 * | 1/2003 | Liu et al. | 156/245 |
| 2004/0007779 | A1 * | 1/2004 | Arbuthnot et al. | 257/780 |
| 2006/0065978 | A1 * | 3/2006 | Nishiyama et al. | 257/737 |
| 2008/0303142 | A1 * | 12/2008 | Kim et al. | 257/737 |
| 2011/0001250 | A1 * | 1/2011 | Lin et al. | 257/778 |
| 2011/0101519 | A1 * | 5/2011 | Hsiao et al. | 257/737 |
| 2011/0193219 | A1 * | 8/2011 | Lai et al. | 257/737 |
| 2011/0215476 | A1 * | 9/2011 | Lee et al. | 257/762 |
| 2011/0260316 | A1 * | 10/2011 | Jang et al. | 257/737 |
| 2012/0098130 | A1 * | 4/2012 | Yip et al. | 257/738 |
| 2012/0305631 | A1 * | 12/2012 | Feger et al. | 228/176 |

* cited by examiner

*Primary Examiner* — Mohammed Shamsuzzaman

(74) *Attorney, Agent, or Firm* — Eschweiler & Associates, LLC

(57) ABSTRACT

The disclosure is directed to a device and method for manufacture thereof. The device includes a first workpiece bonded to a second workpiece by a bump interconnection structure. The bump interconnection structure allows for optimized packaging assembly yield and bond integrity.

12 Claims, 3 Drawing Sheets

BUMP INTERCONNECTION TECHNIQUES

BACKGROUND

In the packaging of semiconductor chips, the semiconductor chips are often bonded with package substrates. Solders are used to join the bumps in the semiconductor chips to the bond pads in the package substrates. When two semiconductor chips (or one semiconductor chip and a package substrate) are bonded, solder may be pre-formed on one, or both, of the bumps/pads of the semiconductor chips. A re-flow is then performed so that the solder joins the semiconductor chips.

DETAILED DESCRIPTION

Figure 1A:
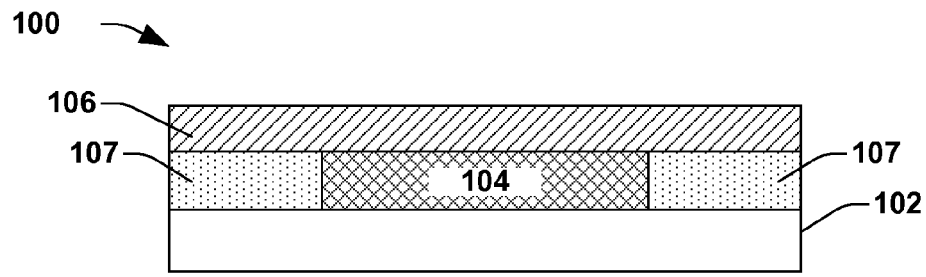
FIGS. 1A-1F are partial cross sectional views illustrating steps of one embodiment of forming a device in accordance with the disclosure.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

A current common requirement for an advanced electronic circuit and particularly for circuits manufactured as integrated circuits ("ICs") in semiconductor processes is the use of solder bump, solder ball or solder column interconnections. In a "flip chip" approach to packaging and interconnections, the solder bumps are used to couple the external terminals of a monolithic integrated circuit (which may be a silicon substrate with active or passive circuit elements and connections formed upon it, or other substrate materials including gallium arsenide (GaAs) and silicon on insulator (SOI), and silicon germanium (SiGe) may be used) to a package substrate or circuit board. These integrated circuit devices may have tens or hundreds of input and output terminals for receiving, and sending, signals and/or for coupling to power supply connections. In some IC designs the terminals are placed at the periphery of the integrated circuit and away from the active circuitry. In more advanced and complex integrated circuits, the terminals may be placed over the active area and lie over the active devices. In memory ICs, sometimes a center pad arrangement is used.

To achieve profile miniaturization and increased functionality, circuits formed on a circuit board or package substrate are getting more densely arranged. Conventional interconnection methods require a melting process to join the bumps (conventionally, solder bumps) onto the mating surfaces of corresponding capture pads. Pad pitch between adjacent contact/conductive pads on the circuit board or substrate is reduced in order to provide for the more dense arrangements. Under this condition, the area of the contact/conductive pads exposed from a solder mask layer is also reduced, making the solder bumps difficult to align with and bond well to the exposed area of the pads. This adversely affects yield. Further, as solder resist openings become smaller, it is difficult to obtain flow of solder into the openings.

Therefore, conventional pre-solder structures formed on the substrate suffer significant problems such as increased material cost, difficulties during the fabrication processes and degraded reliability. Since the pitch between the conductive pads cannot be reduced, migration of copper particles and flash of the melted solder materials during reflow-soldering are caused, thus leading to bridging or short circuit between two conductive pads.

Accordingly, the present disclosure is directed to a device and a method of fabricating the device whereby bump interconnect structures can be formed which accommodate reductions in pitch between adjacent contact/conductive pads, as well as eliminating difficulties associated with solder reflow into smaller solder resist openings and problems associated therewith, thereby increasing assembly yield and bond integrity.

FIGS. 1A-1F illustrate a plurality of partial cross section diagrams illustrating one embodiment of a method of forming a device having a bump interconnection at stages in the manufacturing process according to the disclosure. Referring to FIG. 1A, a first workpiece 100, which includes substrate 102, is provided. Substrate 102 can be a semiconductor substrate, package substrate, board (e.g., a printed circuit board (PCB)), or other suitable substrate. A metallization region 104 is formed in a top-level inter-layer dielectric layer 107, which is a portion of conductive routes and has an exposed surface treated by a planarization process, such as chemical mechanical polishing (CMP), if necessary. Suitable materials for the metallization region 104 include, for example copper (Cu), or copper alloy, or other mobile conductive materials. In some embodiments, the metallization region 104 is a metal pad region 104, which may be used in the bonding process to connect the integrated circuits in the respective chip to external features.

FIG. 1A further illustrates a protective layer 106 formed on the substrate 102 overlying the metallization region 104. In some embodiments, the protective layer 106 includes an Ajinimoto buildup film (ABF) or an organic dielectric material. In some other embodiments, the protective layer 106 is formed of a polymer layer, such as an epoxy, polyimide, benzocyclobutene (BCB), polybenzoxazole (PBO), and the like. The thickness of the protective layer can be from about 5 μm to about 30 μm. The protective layer can be formed by taping or coating, and the like.

Figure 1B:
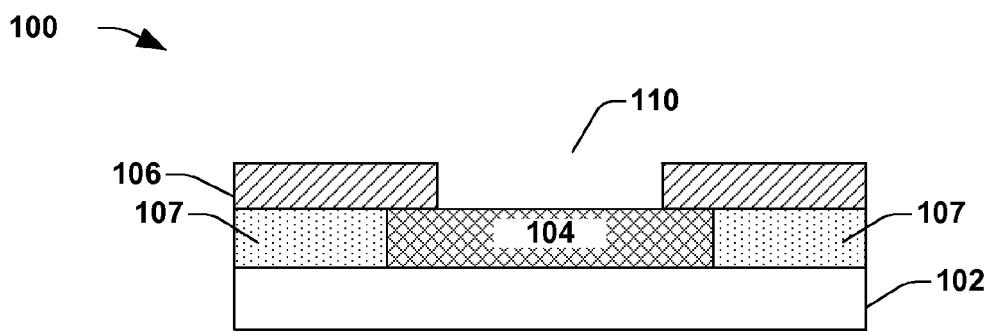
Figure 1C:
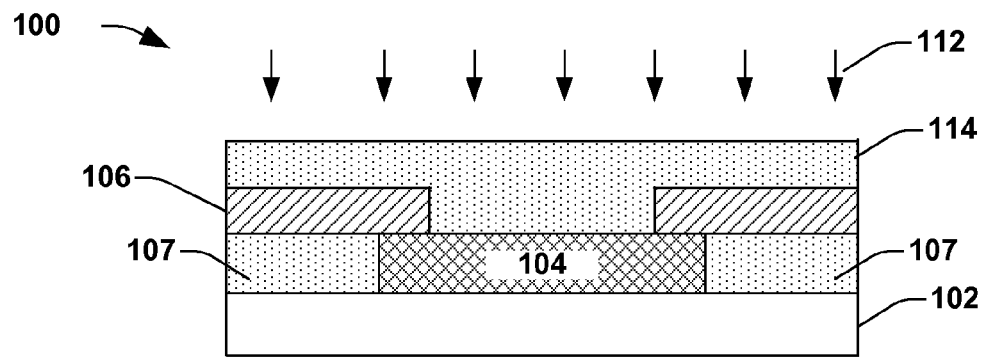

Following patterning and development by photolithographic processes, protective layer 106 is provided with an opening 110 therein, as illustrated in FIG. 1B. Opening 110 exposes a portion of the metallization region 104. In FIG. 1C, a metal layer 114 is deposited 112 overlying protective layer 106 and filling opening 110. In some embodiments, metal layer 114 is deposited by plating. In some embodiments, metal layer 114 is formed of substantially pure copper, or is a copper alloy.

Figure 1D:
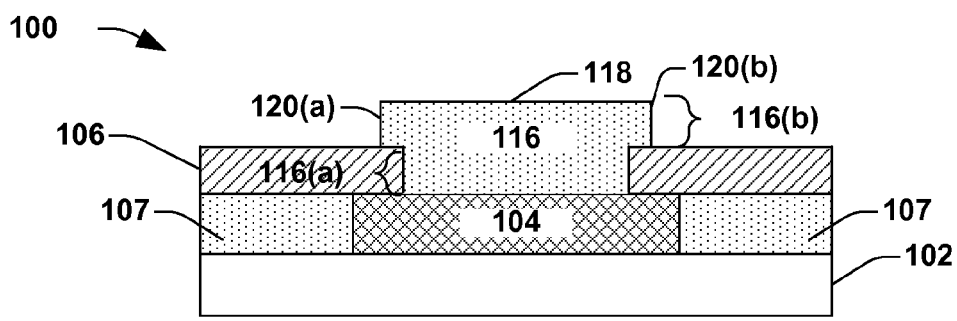

FIG. 1D illustrates solder coupling element 116 formed from metal layer 114. The solder coupling element 116 includes a lower portion 116(a) comprising a vertical element extending through the opening 110 past an outer surface of the protective layer, and an upper portion 116(b) having a top surface 118 and opposing sidewalls 120(a), 120(b), the opposing sidewalls 120(a), 120(b) extending over a portion of protective layer 106 to form a metal pad 116(b). Once the layer of Cu/Cu alloy metal layer 114 has been formed, a suitable technique such as photolithography and etching can be used to pattern the Cu/Cu alloy metal layer 114 to form upper portion 116(b) of solder coupling agent 116. Upper portion or metal pad 116(b) can be formed to have a thickness of from about 5 μm to about 25 μm. Solder coupling element 116 is electrically coupled to the metallization region 104.

Figure 1E:
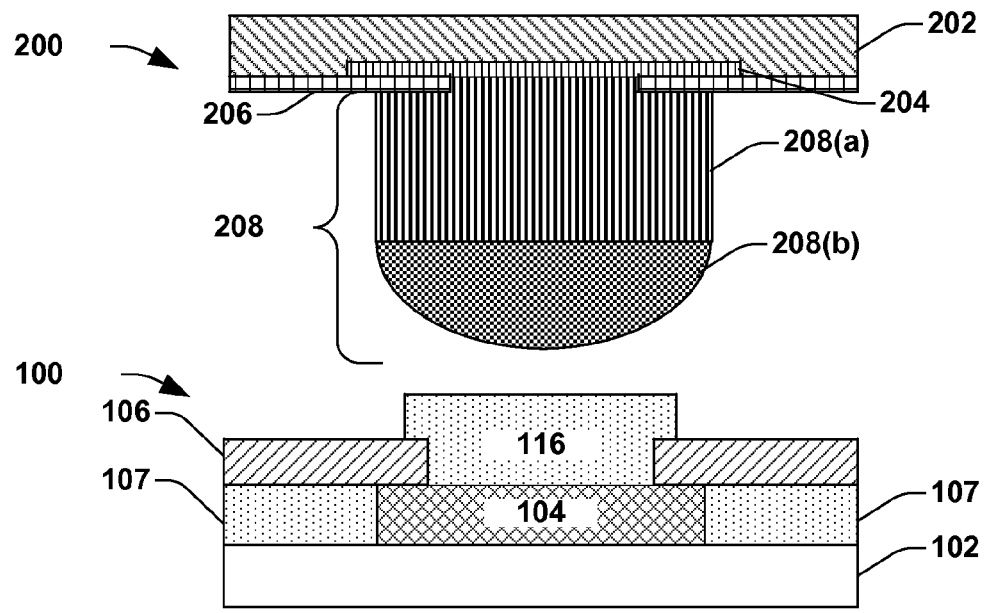

Second workpiece 200 is illustrated in FIG. 1E. Second workpiece 200 includes substrate 202. In some embodiments, substrate 202 comprises a semiconductor substrate as employed in a semiconductor integrated circuit fabrication, and integrated circuits are formed therein and/or thereupon. The semiconductor substrate is defined to mean any construction comprising semiconductor materials, including, but not limited to, bulk silicon, a semiconductor wafer, a silicon-on-insulator (SOI) substrate, or a silicon germanium substrate. Other semiconductor materials including group III, group IV, and group V elements may also be used. The substrate 202 can further comprise a plurality of isolation features (not shown), such as shallow trench isolation (STI) features or local oxidation of silicon (LOCOS) features. The isolation features may define and isolate the various microelectronic elements (not shown). Examples of the various microelectronic elements that may be formed in the substrate 202 include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. Various processes are performed to form the various microelectronic elements including deposition, etching, implantation, photolithography, annealing, and other suitable processes. The microelectronic elements are interconnected to form the integrated circuit device, such as a logic device, memory device (e.g., SRAM), RF device, input/output (I/O) device, system-on-chip (SoC) device, combinations thereof, and other suitable types of devices.

The substrate 202 further includes inter-layer dielectric layers and a metallization structure overlying the integrated circuits. The inter-layer dielectric layers in the metallization structure include low-k dielectric materials, un-doped silicate glass (USG), silicon nitride, silicon oxynitride, or other commonly used materials. The dielectric constants (k value) of the low-k dielectric materials may be less than about 3.9, or less than about 2.8. Metal lines in the metallization structure may be formed of copper or copper alloys. One skilled in the art will realize the formation details of the metallization layers.

The substrate 202 of workpiece 200 further includes a bonding pad 204. The bonding pad 204 is a top metallization layer formed in a top-level inter-layer dielectric layer, which is a portion of conductive routes and has an exposed surface treated by a planarization process, such as a chemical mechanical polishing (CMP), if necessary. Suitable materials for the bonding pad 204 include, but are not limited to, copper, aluminum, copper alloy, or other mobile conductive materials. A passivation layer 206 is provided on the substrate 202 and patterned to expose a portion of the bonding pad 204. In some embodiments, the passivation layer 206 is formed of a non-organic material comprising one or more of un-doped silicate glass (USG), silicon nitride, silicon oxynitride, silicon oxide, and combinations thereof. In some embodiments, the passivation layer 206 is formed of a polymer, such as an epoxy, polyimide, benzocyclobutene (BCB), polybenzoxazole (PBO), and the like.

A bump structure 208 is formed over an exposed portion of the bonding pad 204 of the workpiece 200. Bump structure 208 provides direct electrical connection onto workpiece 100. Bump structure 208 includes a metal bump 208(a) and a solder cap 208(b), each formed by suitable processes. Metal bump 208(a) and solder cap 208(b) can comprise any suitable material. In some embodiments, metal bump 208(a) is formed of copper, which is referred to as a copper bump. The thickness of the metal bump 208(a) is from about 5 μm to about 60 μm. The solder cap 208(b) comprises Sn, SnAg, Sn—Pb, SnAgZn, SnZn, sNbI—In, Sn—In, Sn—Au, SnPb, SnCu, SnZnIn, or SnAgSb, and the like. The thickness of the solder cap 208(b) is, in some embodiments, greater than 25 μm.

Figure 1F:
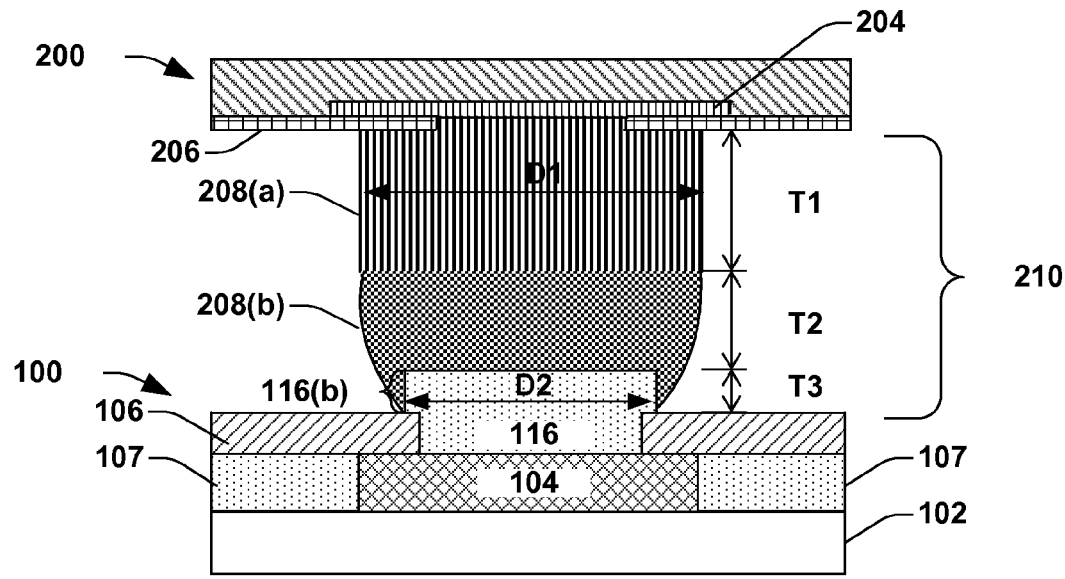

In FIG. 1F, second workpiece 200 is positioned proximate to first workpiece 100. In some embodiments, prior to positioning second workpiece 200, first workpiece 100 is provided with an optional solder region (not shown) overlying the top surface 118 of solder coupling element 116. Bump structure 208 is coupled to workpiece 100, forming a bond between solder cap 208(b) of second workpiece 200 and solder coupling element 116 of first workpiece 100 to form a bump interconnection structure 210, with solder cap 208(b) extending around opposing sidewalls 120(a), 120(b) of upper portion 116(b) of solder coupling element 116. In some embodiments, coupling process includes a flux application, workpiece 100, 200 placement, reflow of solder cap 208(b), and cleaning of flux residue. The first workpiece 100, bump interconnection structure 210 and second workpiece 200 can be referred to as a packaging assembly.

FIG. 1F illustrates several dimensions/characteristics related to the bump interconnection structure 210. The dimensions/characteristics include a metal bump thickness (T1), a solder cap thickness (T2), and a metal pad thickness (T3). The dimensions/characteristics further include a diameter (D1) of metal bump 208(a) and diameter (D2) of upper portion 116(b) of metal pad (116). These dimensions/characteristics of the bump interconnection structure 210 provide optimized packaging assembly yield and bond integrity. Thus, a ratio of thickness of metal bump 208(a) to solder cap 208(b) to metal pad 116(b) is, in some embodiment, from about 1:1:0.5 to about 1:1.5:1. Further, a ratio of the diameter of the metal bump 208(a) to the diameter of the metal pad 116(b) is from about 1.2-1.45:1 in some embodiments.

Figure 2:
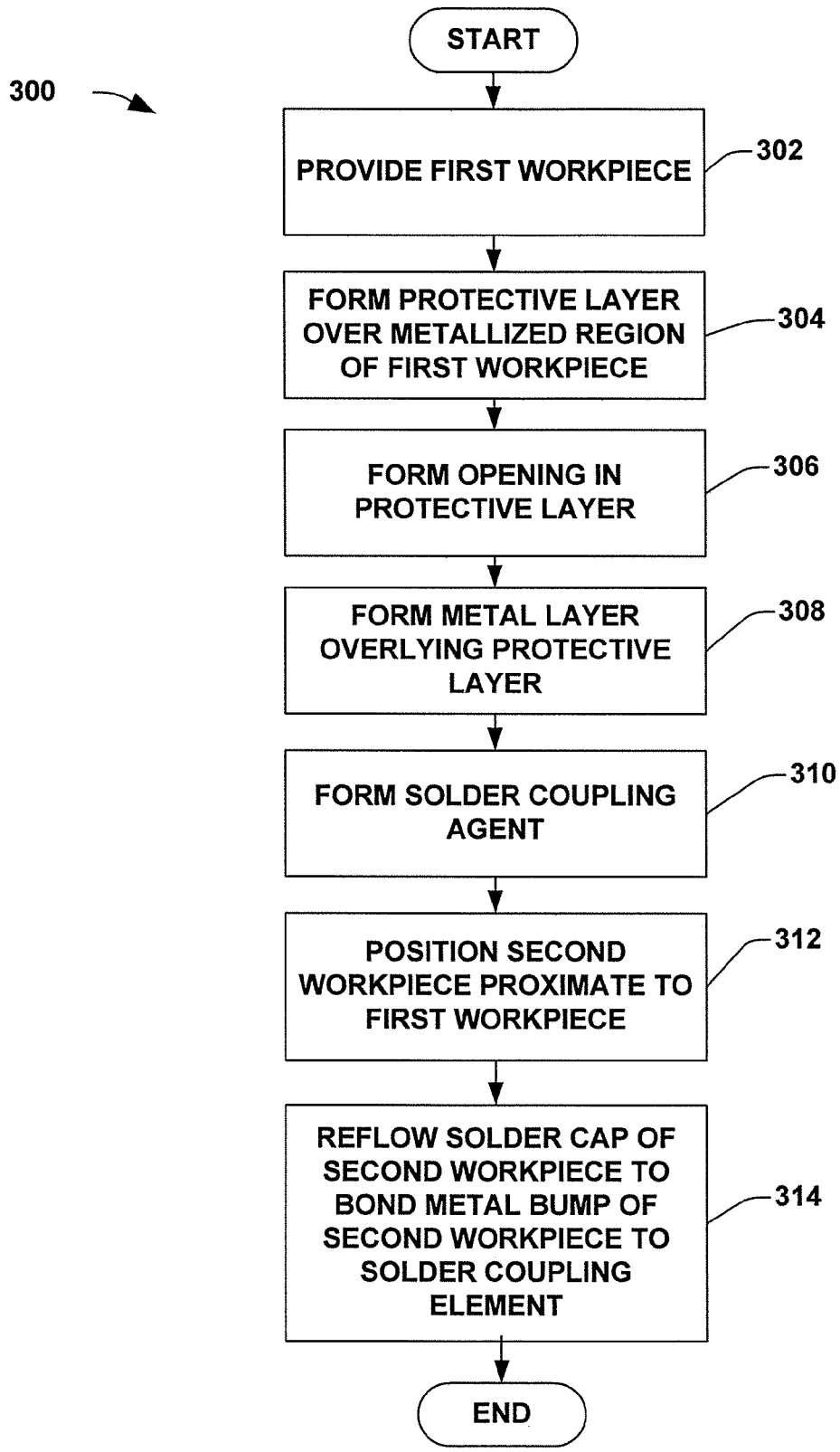
FIG. 2 illustrates a flow diagram of some embodiments of a method for the fabrication of the device in accordance with the disclosure.

FIG. 2 illustrates a flow diagram of some embodiments of a method 300 for formation of a device. While method 300 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At step 302 a first workpiece is provided. A protective layer is formed over a metallized region of the first workpiece at step 304.

At step 306, at least one opening is formed in the protective layer. A metal layer is then formed overlying protective layer and filling the opening in step 308.

At step 310 solder coupling element is formed by photolithographically patterning and etching the metal layer.

At step 312, a second workpiece is positioned proximate to the first workpiece.

At step 314, solder cap of the second workpiece is reflowed to bond the metal bump of the second workpiece to the solder coupling element of the first workpiece, forming a bump interconnection structure.

It will be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, the disclosure relates to a device comprising a first workpiece and a second workpiece. The first workpiece includes a substrate having a metallized region thereon. The first workpiece further includes a protective layer having an opening therein which exposes a portion of the metallized region, and a solder coupling element electrically coupled to the metalized area and extending through the opening past an outer surface of the protective layer. The second workpiece is coupled to first workpiece and includes a bump structure having a metal bump and a solder cap bonding the metal bump to the solder coupling element.

The disclosure further relates to a method of forming a device comprising providing a first workpiece having a substrate including a metallized area thereon. The method further includes forming a protective layer overlying the metallized area and patterning and etching the protective layer to form at least one opening therein. The method further includes forming a solder coupling element extending from the metallized area through the at least one opening. The method further includes positioning a second workpiece proximate to the first workpiece, the second workpiece having a metal bump thereon and a solder cap bonded to the metal bump. The method further includes reflowing the solder cap to bond the metal bump of the second workpiece to the solder coupling element of the first workpiece.

What is claimed is:

1. A device comprising:
   (a) a first workpiece comprising:
   a first substrate having an interlayer dielectric thereover and a first metallized region in the interlayer dielectric;
   a first protective layer overlying the interlayer dielectric and overlying a peripheral portion of the first metallized region, the first protective layer having a first opening therein exposing a central portion of the first metallized region; and
   a solder coupling element comprising a lower portion extending upward from the first metallized region through the first opening, and an upper portion having opposing sidewalls and an upper surface extending past an upper surface of the first protective layer; and
   (b) a second workpiece coupled to the first workpiece and comprising:
   a second substrate having a second metallized region thereon;
   a second protective layer at least partially underlying the second metallized region, the second protective layer having a second opening therein exposing a portion of the second metallized region;
   a metal bump extending through the second opening past a lower surface of the second protective layer, wherein a ratio of a diameter of the metal bump to a diameter of the upper portion of the solder coupling element is from about 1.2-1.45:1; and
   a solder cap bonding the metal bump to the upper portion of the solder coupling element, the solder cap having a meniscus having a maximum width at a lower surface of the metal bump and having a minimum width at the upper surface of the first protective layer.

2. The device of claim 1, wherein the solder coupling element and the metal bump comprise copper or copper alloy.

3. The device of claim 1, wherein a thickness of the solder cap as measured between the lower surface of the metal bump and the upper surface of the first protective layer is greater than 25 μm.

4. The device of claim 1, wherein the first protective layer comprises an epoxy material.

5. The device of claim 1, wherein a ratio of thicknesses of the metal bump:solder cap:upper portion of the solder coupling element is from about 1:1:0.5 to 1:1.5:1.

6. The device of claim 1, wherein the solder cap extends around opposing sidewalls of the upper portion of the solder coupling element.

7. The device of claim 1, wherein a thickness of the metal bump is from about 5 μm to about 60 μm.

8. The device of claim 1, wherein the first workpiece is a package substrate and the second workpiece is a semiconductor chip comprising integrated circuits.

9. The device of claim 1, wherein a thickness of the upper portion of the solder coupling element is from about 5 μm to about 25 μm.

10. The device of claim 1, wherein the solder coupling element has a planar upper surface extending continuously between the opposing sidewalls of the upper portion of the solder coupling element.

11. The device of claim 10, wherein the planar upper surface of the solder coupling element is directly coupled to the solder cap of the second workpiece.

12. The device of claim 1, wherein the solder coupling element is made of copper or copper alloy.

* * * * *